United States Patent [19]

Matsui et al.

[11] Patent Number: 5,373,179
[45] Date of Patent: Dec. 13, 1994

[54] PROTECTIVE DEVICE FOR SEMICONDUCTOR IC

[75] Inventors: Hiromichi Matsui, Kagoshima; Isao Hirota, Kanagawa; Hideto Isono, Kanagawa; Hiroshi Hibi, Kanagawa, all of Japan

[73] Assignee: Sony Corportion, Tokyo, Japan

[21] Appl. No.: 103,094

[22] Filed: Aug. 6, 1993

[30] Foreign Application Priority Data

Aug. 24, 1992 [JP] Japan .................................. 4-248717

[51] Int. Cl.⁵ ....................... H01L 29/06; H01L 29/78
[52] U.S. Cl. .................... 257/355; 257/215; 257/357; 257/361; 257/362
[58] Field of Search ............... 257/256, 280, 362, 215, 257/355, 356, 361

[56] References Cited

U.S. PATENT DOCUMENTS

| 3,787,717 | 1/1974 | Fischer et al. | 257/362 |
| 4,511,813 | 4/1985 | Pan | 257/280 |

FOREIGN PATENT DOCUMENTS

WO82/02799  8/1982  WIPO .................. 257/256

Primary Examiner—J. Carroll
Attorney, Agent, or Firm—Jay H. Maioli

[57] ABSTRACT

A protective circuit protects a plurality of protected portions having different withstand voltages and operation voltages of an active portion of a CCD solid state imaging device or the like by protective elements (e.g., transistors). The respective protected portions can be protected in an optimum fashion in response to the withstand voltages and operation voltages thereof. The breakdown voltages of the respective protective transistors are made different in response to the withstand voltages and operation voltages of the protected portions.

7 Claims, 5 Drawing Sheets

PROTECTIVE DEVICE FOR SEMICONDUCTOR IC

BACKGROUND OF THE INVENTION

1. Field of the Invention

The present invention relates to protective device and, more particularly, to a protective device in which protective elements formed of bipolar transistors are provided at every protected portion so as to prevent breakdown such as a potential shift or the like from being caused at the active portions of a CCD (charge coupled device) solid state imaging device or the like.

2. Description of the Prior Art

FIG. 1 of the accompanying drawings shows a cross section from a horizontal register to an output section of a solid state imaging device of a CCD vertical type overflow drain structure.

Referring to FIG. 1, a channel region 10 of a horizontal CCD 19 is formed on the surface side of a p-type well 16. On the p-type well 16 are formed transfer electrodes which comprise storage gates 11 and transfer gates 12, the gates 11 and 12 each being made of a first polysilicon 1POLY and a second polysilicon 2POLY, respectively. The gates 11 and 12 are insulated from the silicon substrate 16 by means of a gate insulation film 17. Beneath the electrodes of the transfer gates 12 to which horizontal transfer clock signals $\phi_{H1}$ and $\phi_{H2}$ are applied are ion implantation regions (P−) 18. The regions 18 are intended to make the potential shallower for implantation of two-phase drive.

A horizontal output gate 9 at the left-hand end of the horizontal CCD 19 is generally kept to a DC potential level such as ground level. A reset gate 13 is provided to reset the change in the potential of an FD (floating diffusion) region 7, the change being attributable to the charge signal given per picture element. With this arrangement, the potential of the FD region 7 is reset to the potential of a reset drain 14.

FIG. 2 is a fragmentary circuit diagram showing the portion of a protective device in which a plurality of portions of a CCD vertical type overflow drain structure solid state imaging device are protected by a plurality of protective elements.

In FIG. 2, reference numerals T1, T2, T3 denote terminals (input terminals), respectively. Reference symbol Lc1 denotes one capacitance load (e.g., gate of transfer register or the like), Lj a junction load (e.g., reset drain of horizontal register), and Lc2 another capacitance load (gate load). Operation voltages A1 to A3 thereof, maximum values a1, a2, a3 of the operation voltages A1 to A3 and breakdown voltages (withstand voltages) D1 to D3 thereof are different as shown in FIG. 3.

As shown in FIG. 2, there are provided bipolar protective transistors $Q1_1$, $Q1_2$ and $Q1_3$ which protect the aforesaid load portions. Collector electrodes C of the respective protective transistors $Q1_1$, $Q1_2$ and $Q1_3$ are formed of an n-type substrate of a CCD solid state imaging device of a vertical type overflow drain structure and are kept at ground level. Base electrodes B thereof are formed of a p-type well region formed on the n-type substrate and to which there is applied a potential of −9 V, for example. Emitter electrodes E of the protective transistors $Q1_1$, $Q1_2$ and $Q1_3$ are connected to terminals on the opposite side of the ground of the loads that are to be protected. In the prior art, characteristics of the protective transistors $Q1_1$, $Q1_2$, $Q1_3$ are exactly the same and the breakdown voltages B thereof also are exactly the same as shown in FIG. 3.

The protecting operation done by the protective transistors will be described below.

When the terminal T is set to low potential, a forward voltage is supplied to an emitter-base path of the protective transistor and the protective transistor is turned on. Thus, a collector current is flowed to the protective transistor and the potential at the terminal T can be prevented from being lowered more than this by the collector current. Therefore, it is possible to prevent the load from being destroyed when the potential at the terminal T is lowered abnormally.

When the potential at the terminal T is increased abnormally, a reverse voltage that is in excess of the breakdown voltage of the protective transistor is applied to the emitter-base path of the protective transistor. Then, an emitter-base junction breaks down so that a current is flowed from the terminal side through the emitter-base path. By this current, it is possible to prevent the potential at the terminal T from being increased in excess of the breakdown voltage. Therefore, the loads can be prevented from being broken by the extraordinary high voltage.

In the prior art, the loads are protected by the same protective transistors $Q1_1$ to $Q1_2$ of breakdown voltage B regardless of difference between the withstand voltages and the operation voltages of the protected loads. Consequently, the loads cannot be protected in an optimum fashion in response to the withstand voltages and the operation voltages thereof. By way of example, breakdown margins E1, E2 are not satisfactory as in the cases 1 and 2 of FIG. 3. If the breakdown voltages B of the protective transistors $Q1_1$, $Q1_2$ and $Q1_3$ are lowered uniformly, then in the case 3 of FIG. 3, the breakdown voltage B approaches the maximum value a3 of the operation voltage to obstruct a stable operation.

In particular, the breakdown voltages B of the protective transistors fluctuate by an amount C upon production. If such fluctuated amount C is taken into consideration, then the breakdown margin becomes smaller. Consequently, the loads cannot be protected reliably and the operation of the protective transistor cannot be stabilized. There is then the problem that cannot be neglected when the loads are protected by the protective transistors of the same breakdown voltage B regardless of the difference of the withstand voltages and the operation voltages.

OBJECTS AND SUMMARY OF THE INVENTION

Therefore, it is an object of the present invention to provide an improved semiconductor device in which the aforesaid shortcomings and disadvantages encountered with the prior art can be eliminated.

More specifically, it is an object of the present invention to provide a semiconductor device in which protected portions whose withstand voltages and operation voltages are different can be protected in an optimum fashion.

It is another object of the present invention to provide a semiconductor device in which protected portions can be protected stably.

According to a first aspect of the present invention, there is provided a semiconductor device formed on a semiconductor body which comprises a first electrical element formed on the semiconductor body wherein the first electrical element operates within a first voltage area and has a first breakdown voltage, a second electrical element formed on the semiconductor body wherein the second electrical element operates within a second voltage area and has a second breakdown voltage different from the first breakdown voltage, a first protection element for protecting the first electrical element from breaking down, wherein the first protection element operates at a first voltage which is set according to the first voltage area and first breakdown voltage, and a second protection element for protecting the second electrical element from breaking down, wherein the second protection element operates at a second voltage which is set according to the second voltage area and second breakdown voltage, the first and second voltages being independent of each other.

According to a second aspect of the present invention, there is provided a semiconductor device formed on a semiconductor body which comprises a first electrical element formed on the semiconductor body wherein the first electrical element operates within a first voltage area and has a first breakdown voltage, a second electrical element formed on the semiconductor body wherein the second electrical element operates within a second voltage area and has a second breakdown voltage different from the first breakdown voltage, a first bipolar transistor having a first emitter electrode connected to the first electrical element, a first base electrode connected to a first voltage and a first collector electrode connected to a second voltage, the first bipolar transistor protecting the first electrical element from breaking down such that the first bipolar transistor breaks down at a first predetermined breakdown voltage which is set according to both the first voltage area and first breakdown voltage, and a second bipolar transistor having a second emitter electrode connected to the second electrical element, a second base electrode connected to a first voltage and a second collector electrode connected to a second voltage, the second bipolar transistor protecting the second electrical element from breaking down such that the second bipolar transistor breaks down at a second predetermined breakdown voltage which is set according to both the second voltage area and second breakdown voltage, the first and second predetermined voltages being independent of each other.

In accordance with a third aspect of the present invention, there is provided a charge transfer device formed on a semiconductor body which comprises a shift register having a plurality of closely spaced transfer electrodes formed on and insulated from the semiconductor body, wherein the transfer electrodes operate within a first voltage area and has a first breakdown voltage, a reset transistor coupled to the shift register and having a source formed adjacent to the shift register and a reset drain formed apart from the source, wherein the reset drain operates within a second voltage area and has a second breakdown voltage different from the first breakdown voltage, a first protection element connected to the transfer electrodes, wherein the first protection element operates over a first predetermined voltage which is set according to the first voltage area and first breakdown voltage, and a second protection element connected to the reset drain, wherein the second protection element operates over a second predetermined voltage which is set according to the second voltage area and second breakdown voltage, the first and second predetermined voltages being independent of each other.

The above and other objects, features, and advantages of the present invention will become apparent from the following detailed description of illustrative embodiments thereof to be read in conjunction with the accompanying drawings, in which like reference numerals are used to identify the same or similar parts in the several views.

DETAILED DESCRIPTION OF THE PREFERRED EMBODIMENTS

Embodiments of the protective device according to the present invention will hereinafter be described in detail with reference to the drawings.

Figure 4:
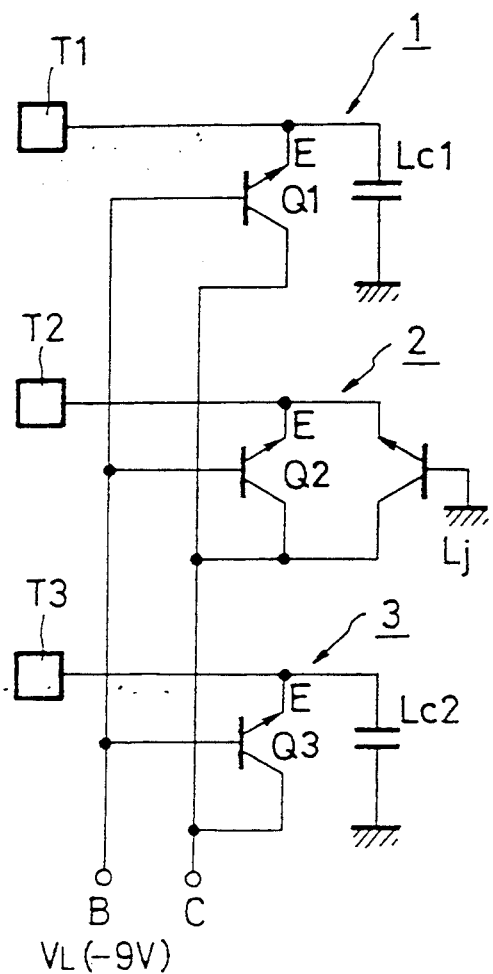
FIG. 4 is a circuit diagrams showing a protective device according to a first embodiment of the present invention.
Figure 5:
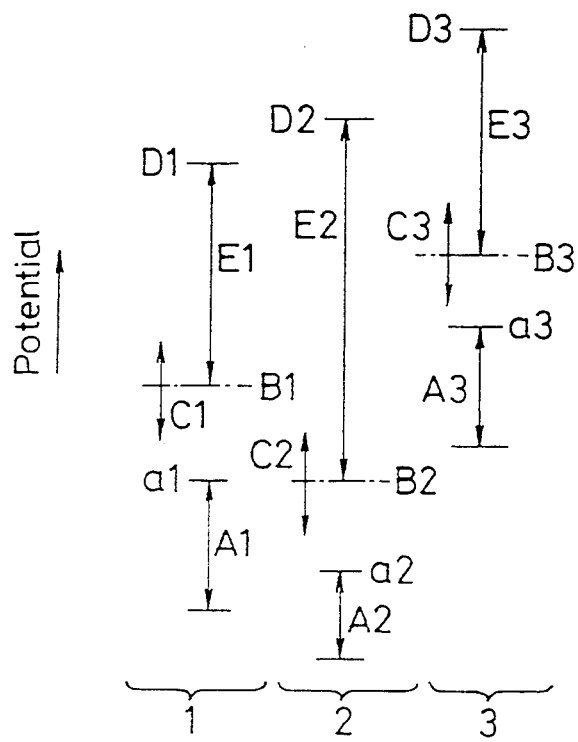
FIG. 5 is a diagram used to explain a potential relationship.
Figure 6:
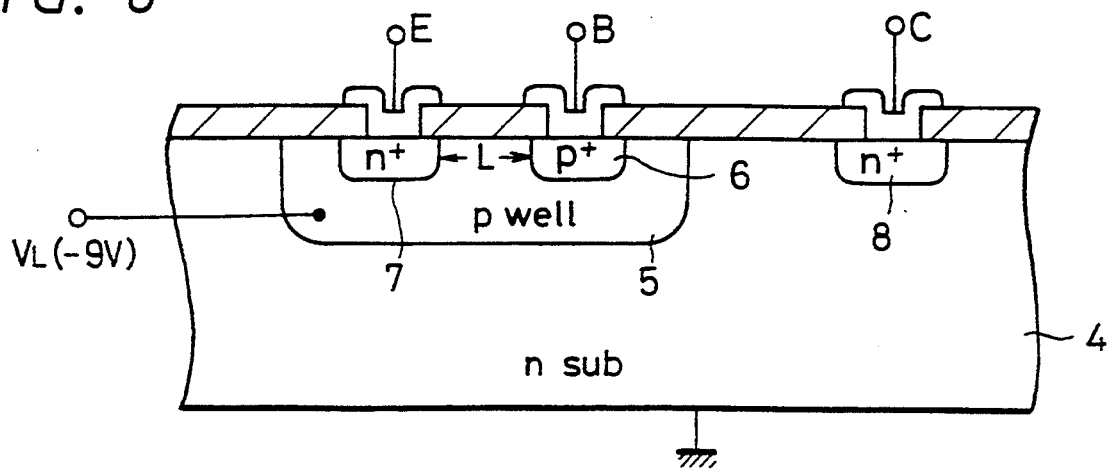
FIG. 6 is a cross-sectional view illustrative of a protective element (transistor) used in the above first embodiment of the present invention.

FIGS. 4 and 5 show a first embodiment of the protective device according to the present invention. FIG. 4 is a circuit diagram showing a circuit arrangement of the protective device according to the first embodiment of the present invention, and FIG. 5 is a diagram used to explain a potential relationship. FIG. 6 is a cross-sectional view illustrative of a protective transistor according to the first embodiment of the present invention.

Figure 1:
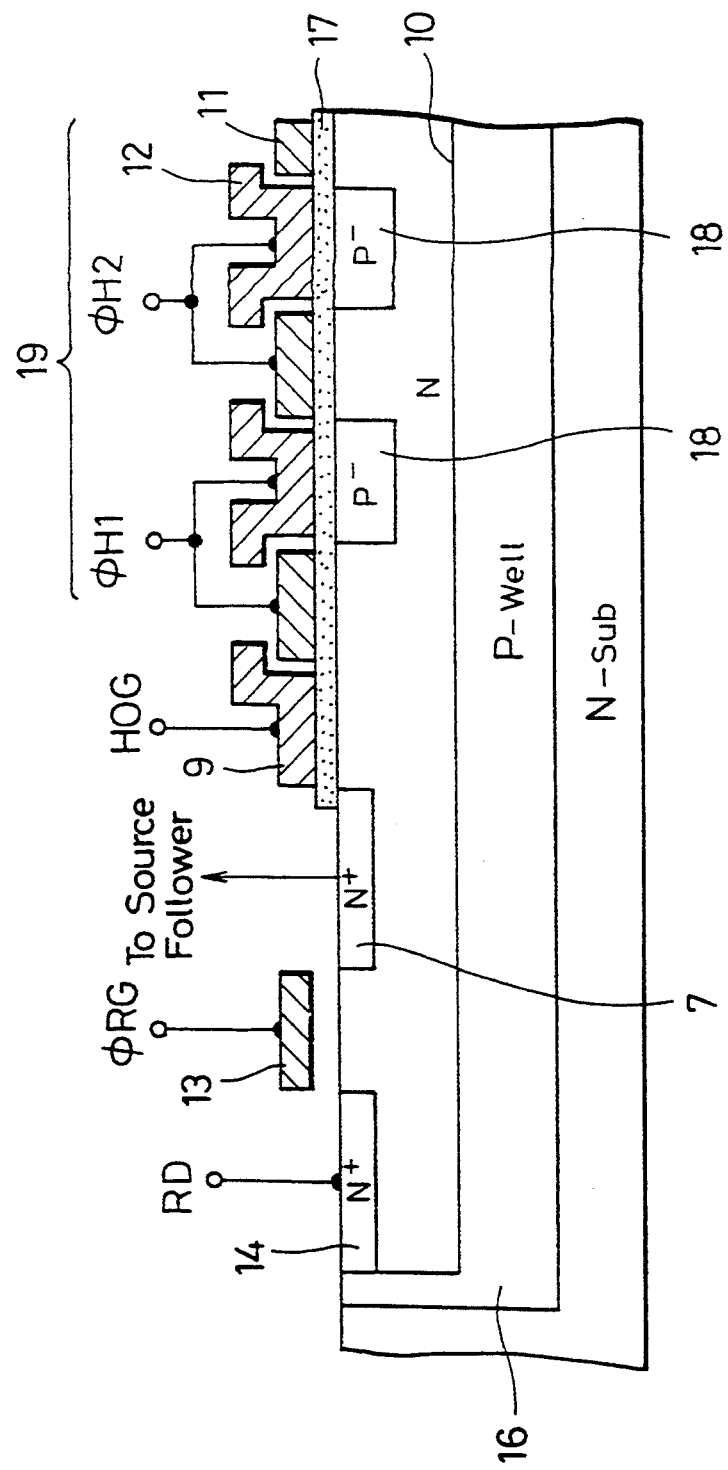
FIG. 1 is a cross-sectional side view showing a cross section from a horizontal register to an output section of a CCD solid state imaging device of a vertical overflow drain structure according to the prior art.
Figure 2:
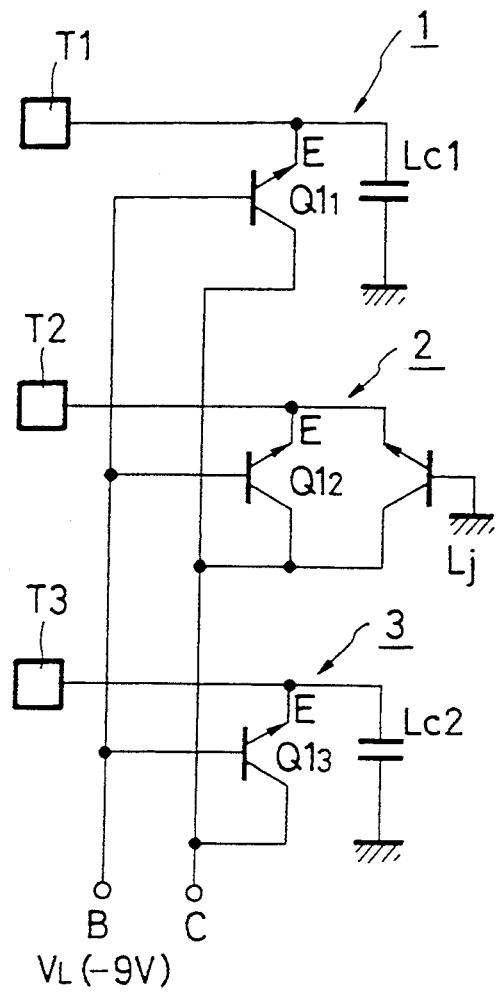
FIG. 2 is a circuit diagram showing a part of a conventional protective device.

Although the protective device according to the first embodiment of the present invention is different from the conventional protective device shown in FIG. 1 in that breakdown voltages of the respective protective transistors are made different in response to operation voltages and breakdown voltages of the protected portions, they are made common in other points. Since these common elements and parts had already been referred to, they need not be described and only different elements and parts will be described below.

As illustrated, there are provided protective transistors Q1, Q2, Q3 which are adapted to protect a capacitance load Lc1, a Junction load Lj, and a capacitance load Lc2, respectively.

A protective circuit 1 is adapted to protect the capacitance load Lc1 by the protective transistor Q1. A protective circuit 2 is adapted to protect the junction load Lj by the protective transistor Q2 and a protective circuit 3 is adapted to protect the capacitance load Lc2 by the protective transistor Q3.

Figure 3:
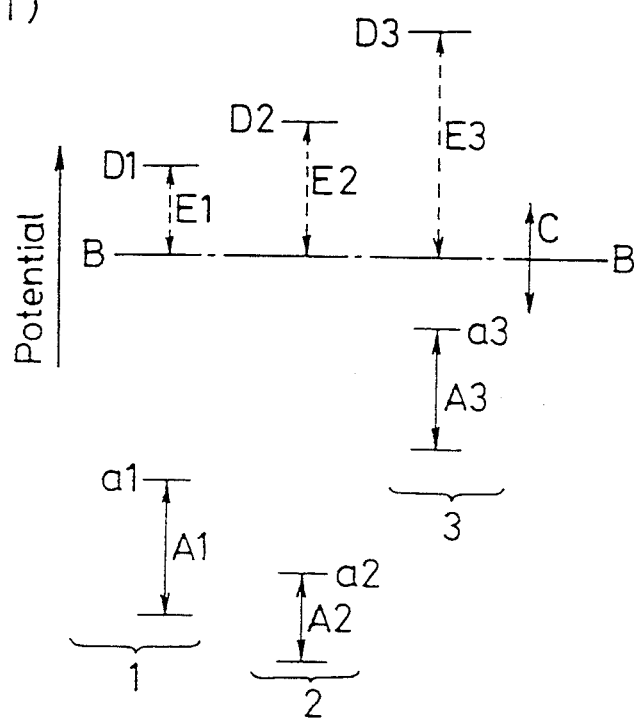
FIG. 3 is a diagram used to explain a potential relationship.

Although operation voltages and withstand voltages of the respective loads Lc1, Lj and Lc2 are the same as those of the prior art (see FIG. 3) as shown in FIG. 5, breakdown voltages B1, B2, B3 of the protective transistors Q1, Q2 and Q3 are made different in response to the operation voltages and withstand voltages of the loads Lc1. Lj and Lc2 as shown in FIG. 5.

To be more concrete, the breakdown voltages B1, B2, B3 are respectively set to values properly higher than maximum values a1, a2, a3 of the operation voltages A1, A2, A3 of the protected loads such that sufficient breakdown margins E1, E2, E3 can be obtained. Therefore, unlike the prior art, the breakdown margins E1, E2 of the first and second protective circuits 1, 2 can be sufficiently increased.

How to make the breakdown voltage of the protective transistor Q different will be described with reference to FIG. 6.

Referring to FIG. 6, there is shown an n-type semiconductor substrate or semiconductor body 4 on which surface there is formed a p-type well region 5. This p-type well region 5 is supplied with a potential of −9 V, for example, and serves as a base electrode. A $p^+$-type base electrode deriving region 6 is formed on the surface portion of the p-type well region 5. An $n^+$-type emitter region 7 is formed on the surface portion of the p-type well region 5 at a different position from that of the base electrode deriving region 6. A collector electrode deriving region 8 is formed on the surface portion of the semiconductor body 4 at the same time when the $n^+$-type emitter region 7 is formed.

In the first embodiment of the present invention, although all the protective transistors Q1, Q2, Q3 have the structure shown in FIG. 6, a distance L between the base electrode deriving region 6 and the emitter region 7 is made different from one another.

That is to say, by effectively utilizing the fact that the breakdown voltage B of the protective transistor is increased as the distance L is increased, the breakdown voltages B1, B2, B3 of the protective transistors Q1, Q2, Q3 are made different by the distances L. Incidentally, the breakdown voltages B1, B2, B3 can be changed by an impurity concentration of the p-type well region 5 serving as the base electrode or impurity concentration of the emitter region 7.

The protective device according to a second embodiment of the present invention will be described with reference to FIGS. 7 and 8. In this embodiment, the protective device is adapted to protect a part when a surge voltage enters between input terminals of elements, such as horizontal registers of CCD solid state imaging device or the like.

Figure 7:
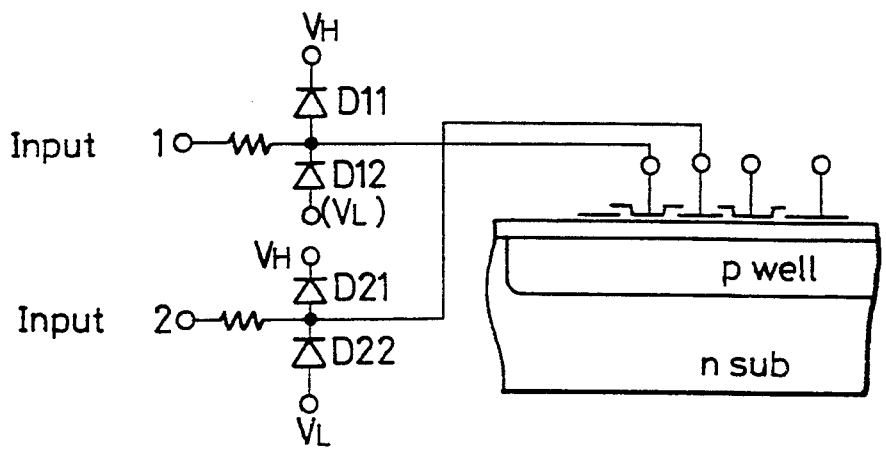
FIG. 7 is a circuit diagram showing the protective device according to a second embodiment of the present invention.
Figure 8:
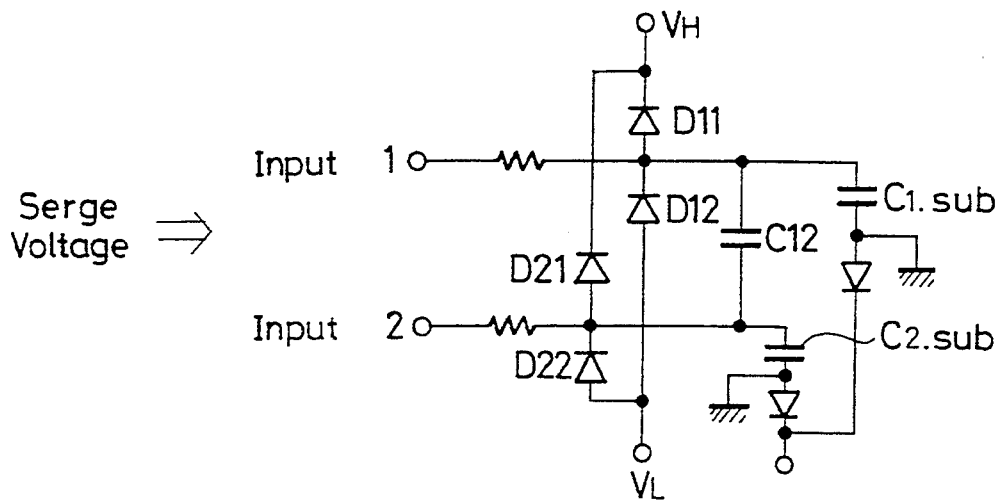
FIG. 8 is a diagram of an equivalent circuit of the protective device shown in FIG. 7.

FIG. 7 is a circuit diagram of the protective device of this embodiment. As shown in FIG. 7, there are provided diodes $D_{11}$, $D_{21}$ which are turned on in the forward direction to protect gates of horizontal registers when an extraordinarily high voltage is applied to input terminals 1 and 2. Diodes $D_{12}$, $D_{22}$ are turned on in the forward direction to protect the gates of the horizontal registers when an extraordinarily low voltage is applied to the input terminals 1 and 2.

A manner that the protective device is operated when the input terminal 2 is kept at 0 V and a plus surge voltage of low frequency is applied to the input terminal 1 will be described with reference to FIG. 8 forming an equivalent circuit of FIG. 7. In FIG. 8, $C_{1\text{-}sub}$, and $C_{2\text{-}sub}$ designate substrate-gate electrode capacitances and C12 designates gate electrode capacitance which is applied with voltages from the input terminals 1, 2.

By the surge voltage applied to the input terminal 1, the diode $D_{12}$ breaks down to raise a minimum potential $V_L$. Then, there are provided a protective path from the input terminal 1 through the diode $D_{11}$, diode $D_{21}$ to the input terminal 2 and a protective path from the input terminal 1 through the diode $D_{12}$, diode $D_{22}$ to the input terminal 2.

Although the operation starting voltage of the protective paths is determined by reverse withstand voltages of the diodes $D_{11}$ and $D_{12}$, if this operation starting voltage is selected to be lower than the breakdown voltage of an oxide film between adjacent gates of the horizontal register and a potential shift starting voltage and a resistance value of the protective paths relative to a surge drive capability is lowered, then the gate sections can be protected. Since a resistance value of the protective paths that utilize a reverse-direction breakdown voltage of the diode can be reduced and a current capacity can be easily increased, the gate sections can be protected more reliably.

When one surge voltage (low frequency surge voltage) is applied to the input terminal 1, the protective circuit that utilizes the breakdown voltages of the diodes $D_{12}$, $D_{22}$ is constructed.

Figure 9:
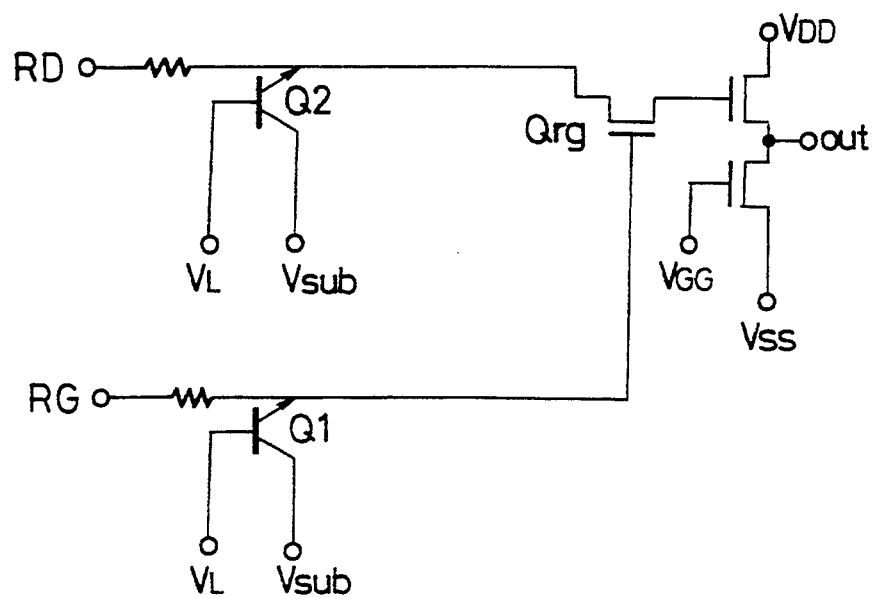
FIG. 9 is a circuit diagram showing the protective device according to a third embodiment of the present invention.
Figure 10:
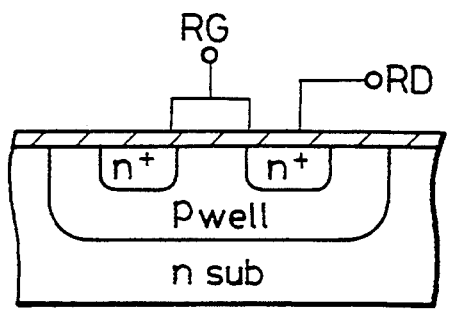
FIG. 10 is a cross-sectional view illustrative of a reset gate transistor used in the third embodiment of the present invention.
Figure 11:
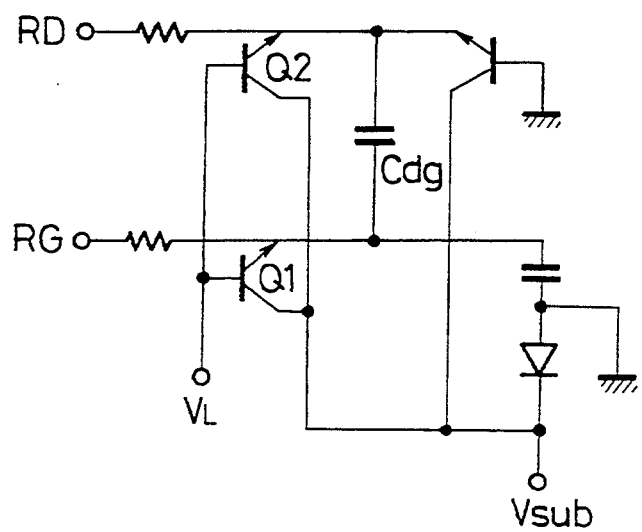
FIG. 11 is a diagram of an equivalent circuit of the third embodiment shown in FIG. 9.

FIGS. 9, 10 and 11 show the protective device according to a third embodiment of the present invention. FIG. 9 is a circuit diagram showing a circuit arrangement of the protective device of this embodiment, FIG. 10 is a cross-sectional view of a reset gate transistor Qrg in FIG. 9 and FIG. 11 is a diagram showing an equivalent circuit of the protective device shown in FIG. 9.

In this embodiment, a reset drain RD and a reset gate RG are protected by the protective transistors Q1, Q2, respectively. The collectors of the respective protective transistors Q1, Q2 are set to a substrate potential ($V_{sub}=0$), the bases thereof are set to a minimum potential ($V_L = -9$ V) and the emitters thereof are coupled to terminals of the protected portions. More specifically, the emitter of the protective transistor Q1 is connected to the reset gate RG and the emitter of the protective transistor Q2 is connected to the reset drain RD, respectively.

Operation of this protective device will be described with reference to FIG. 11 in which case the reset drain RD is set to 0 V and the plus surge voltage is applied to the reset gate RG.

When the plus surge voltage is applied to the reset gate RG, a punch-through phenomenon occurs in the protective transistor Q1 so that the minimum potential $V_L$ is raised. Then, the protective transistor Q2 is turned on so that a current path is formed from the reset gate RG through the emitter electrode of the protective transistor Q1, the collector electrode of the protective transistor Q1, the collector electrode of the protective transistor Q2, and the emitter electrode of the protective transistor Q2 to the reset drain RD. In this case, since the punch-through phenomenon is effectively utilized, the current path is affected by the substrate resistance, the resistance value is high and the current capacitance cannot be obtained with ease.

For this reason, by lowering the emitter-base reverse withstand voltage of the protective transistor Q1, there can be formed a protective path from the reset gate RG through the emitter of the protective transistor Q1, the base of the protective transistor Q1, the base of the protective transistor Q2 and the emitter of the protective transistor Q2 to the reset drain RD. Then, by setting the emitter-base reverse withstand voltage of the protective transistor Q1 to be lower than the breakdown voltage between the reset gate and the reset drain (Cdg) and the potential shift starting voltage, it is possible to protect the path between the reset gate and the reset drain from the surge voltage.

According to the protective device, as set forth, the protective elements are provided in correspondence with a plurality of protected portions whose withstand voltages and/or operation voltages are different to protect the same. Also, the breakdown voltages of the respective protective elements are made different in response to the withstand voltages and operation voltages of the corresponding protected portions. Therefore, since the respective protective elements have breakdown voltages corresponding to the withstand voltages and operation voltages of the protected portions, the protected portions can be protected best in response to the withstand voltages and the operation voltages thereof. Thus, the protected portions can be protected reliably and the operation thereof can be stabilized.

Furthermore, according to the present invention, the respective protective elements are formed of bipolar transistors and the breakdown voltages of the protective elements are made different by the different distances between the base electrode deriving region and the emitter region of the protective elements. Therefore, since the breakdown voltages of the respective protective transistors are made different by the lateral distances between the emitter region and the base electrode deriving region, the breakdown voltages of the respective protective transistors can be made different by the mask pattern without increasing the process.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A semiconductor device formed on a semiconductor body comprising:

a first electrical element formed on said semiconductor body wherein said first electrical element operates within a first voltage area and has a first breakdown voltage;

a second electrical element formed on said semiconductor body wherein said second electrical element operates within a second voltage area and has a second breakdown voltage different from said first breakdown voltage;

a first protection element comprising a bipolar transistor having an emitter electrode, a base electrode add a collector electrode for protecting said first electrical element from breaking down, wherein said first protection element operates at a first voltage which is set according to said first voltage area and first breakdown voltage; and a second protection element comprising a bipolar transistor having an emitter electrode, a base electrode and a collector electrode for protecting said second electrical element from breaking down, wherein said second protection element operates at a second voltage which is set according to said second voltage area and second breakdown voltage, said first and second voltages being independent of each other, wherein each of said first and second voltages is fixed by a distance between .respective emitter electrodes and base electrodes of said first and second protection elements.

2. The semiconductor device according to claim 1, wherein said first electrical element comprises a capacitor.

3. The semiconductor device according to claim 1, wherein said first electrical element comprises a capacitor and said second electrical element comprises a bipolar transistor.

4. A semiconductor device formed on a semiconductor body comprising:

a first electrical element formed on said semiconductor body wherein said first electrical element operates within a first voltage area and has a first breakdown voltage;

a second electrical element formed on said semiconductor body wherein said second electrical element operates within a second voltage area and has a second breakdown voltage different from said first breakdown voltage;

a first bipolar transistor having a first emitter electrode connected to said first electrical element, a first base electrode connected to a first voltage and a first collector electrode connected to a second voltage, said first bipolar transistor protecting said first electrical element from breaking down such that said first bipolar transistor breaks down at a first predetermined breakdown voltage which is set according to both said first voltage area and said first breakdown voltage; and a second bipolar transistor having a second emitter electrode connected to said second electrical element, a second base electrode connected to said first voltage and a second collector electrode connected to said second voltage, said second bipolar transistor protecting said second electrical element from breaking down such that said second bipolar transistor breaks down at a second predetermined breakdown voltage which is set according to both said second voltage area and second breakdown voltage, said first and second predetermined breakdown voltages being independent of each other, wherein each of said first and second predetermined breakdown voltages is fixed by a distance between respective emitter electrodes and base electrodes of said first and second bipolar transistors.

5. The semiconductor device according to claim 4, wherein said first electrical element comprises a transfer electrode of a charge transfer device.

6. The semiconductor device according to claim 4, wherein said second electrical element comprises a reset drain of a charge detector.

7. A charge transfer device formed on a semiconductor body comprising:

a shift register having a plurality of closely spaced transfer electrodes formed on and insulated from said semiconductor body, wherein each of said plurality of transfer electrodes operates within a first voltage area and has a first breakdown voltage;

a reset transistor coupled to said shift register having a source formed adjacent to said shift register and a reset drain formed apart from said source, wherein said reset drain operates within a second voltage area and has a second breakdown voltage different from said first breakdown voltage;

a first protection element comprising a first bipolar transistor having a first emitter electrode connected to said plurality of transfer electrodes, a first base electrode connected to a first voltage line and a first collector connected to a second voltage line, wherein said first protection element operates over a first predetermined voltage which is set according to said first voltage area and said first breakdown voltage; and a second protection element comprising a second bipolar transistor having a second emitter electrode connected to said reset drain, a second base electrode connected to said first voltage line and a second collector electrode connected to second voltage line, wherein said second protection element operates over a second predetermined voltage which is set according to said second voltage area and said second breakdown voltage, said first and second predetermined voltages being independent of each other, wherein each of said first and second predetermined voltages is fixed by a distance between said respective emitter electrodes and base electrodes of said first and second bipolar transistors.

* * * * *

UNITED STATES PATENT AND TRADEMARK OFFICE
CERTIFICATE OF CORRECTION

PATENT NO. : 5,373,179

DATED : December 13, 1994

INVENTOR(S) : Hiromichi Matsui, Isao Hirota, Hideto Isono, and Hiroshi Hibi

It is certified that error appears in the above-identified patent and that said Letters Patent is hereby corrected as shown below:

```
Title page, col. 2,
In the Abstract, line 8, change ". The" to --, and--
Col. 2, line 26, change "Q1_2" to --Q1_3--

Col. 4, line 20, change "diagrams" to --diagram--
        line 67, change "Junction" to --junction--

Co. 7, line 64, change "add" to --and--
```

Signed and Sealed this

Twenty-fourth Day of September, 1996

Attest:

BRUCE LEHMAN

Attesting Officer

Commissioner of Patents and Trademarks